(12) United States Patent
Miyairi et al.

(10) Patent No.: US 9,178,071 B2
(45) Date of Patent: Nov. 3, 2015

(54) METHOD FOR MANUFACTURING SEMICONDUCTOR DEVICE

(75) Inventors: Hidekazu Miyairi, Atsugi (JP); Koji Dairiki, Atsugi (JP); Shunpei Yamazaki, Setagaya (JP); Ryo Arasawa, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 867 days.

(21) Appl. No.: 13/225,703

(22) Filed: Sep. 6, 2011

(65) Prior Publication Data

US 2012/0064677 A1 Mar. 15, 2012

(30) Foreign Application Priority Data

Sep. 13, 2010 (JP) ................................. 2010-204967
Sep. 13, 2010 (JP) ................................. 2010-204970

(51) Int. Cl.
*H01L 21/336* (2006.01)
*H01L 29/786* (2006.01)
*H01L 29/66* (2006.01)

(52) U.S. Cl.
CPC .... *H01L 29/78678* (2013.01); *H01L 29/66765* (2013.01); *H01L 29/78606* (2013.01); *H01L 29/78648* (2013.01); *H01L 29/78669* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 5,231,297 A * | 7/1993 | Nakayama et al. | ............. 257/77 |
| 6,933,989 B2 | 8/2005 | Oke et al. | |
| 7,301,599 B2 | 11/2007 | Choi et al. | |
| 7,738,050 B2 | 6/2010 | Yamazaki et al. | |
| 7,768,621 B2 | 8/2010 | Oke et al. | |
| 2002/0033907 A1 | 3/2002 | Oke et al. | |
| 2005/0237464 A1 | 10/2005 | Oke et al. | |

(Continued)

FOREIGN PATENT DOCUMENTS

| | | |
|---|---|---|
| JP | 11-133455 A | 5/1999 |
| JP | 2001-133804 A | 5/2001 |

(Continued)

*Primary Examiner* — Seahvosh Nikmanesh
(74) *Attorney, Agent, or Firm* — Eric J. Robinson; Robinson Intellectual Property Law Office, P.C.

(57) ABSTRACT

Provided is a method for manufacturing a semiconductor device with fewer masks and in a simple process. A gate electrode is formed. A gate insulating film, a semiconductor film, an impurity semiconductor film, and a conductive film are stacked in this order, covering the gate electrode. A source electrode and a drain electrode are formed by processing the conductive film. A source region, a drain region, and a semiconductor layer, an upper part of a portion of which does not overlap with the source region and the drain region is removed, are formed by processing the upper part of the semiconductor film, while the impurity semiconductor film is divided. A passivation film over the gate insulating film, the semiconductor layer, the source region, the drain region, the source electrode, and the drain electrode are formed. An etching mask is formed over the passivation film. At least the passivation film and the semiconductor layer are processed to have an island shape while an opening reaching the source electrode or the drain electrode is formed, with the use of the etching mask. The etching mask is removed. A pixel electrode is formed over the gate insulating film and the passivation film.

20 Claims, 11 Drawing Sheets

(56) References Cited

U.S. PATENT DOCUMENTS

| | | |
|---|---|---|
| 2007/0102818 A1* | 5/2007 | Sasaki et al. .............. 257/751 |
| 2008/0057607 A1 | 3/2008 | Oke et al. |
| 2009/0001375 A1 | 1/2009 | Yamazaki et al. |
| 2009/0002591 A1 | 1/2009 | Yamazaki et al. |
| 2009/0008645 A1 | 1/2009 | Yamazaki et al. |
| 2009/0029508 A1 | 1/2009 | Yamazaki |

FOREIGN PATENT DOCUMENTS

| | | |
|---|---|---|
| JP | 2002-090779 A | 3/2002 |
| JP | 2004-212933 A | 7/2004 |
| JP | 2007-035964 | 2/2007 |
| JP | 2009-055013 | 3/2009 |
| JP | 2010-230950 | 10/2010 |

\* cited by examiner

METHOD FOR MANUFACTURING SEMICONDUCTOR DEVICE

BACKGROUND OF THE INVENTION

1. Field of the Invention

The present invention relates to a method for manufacturing a semiconductor device. Note that in this specification, a semiconductor device refers to a semiconductor element itself or a device including a semiconductor element. As an example of such a semiconductor element, a transistor (a thin film transistor and the like) can be given. In addition, a semiconductor device also refers to a display device such as a liquid crystal display device.

2. Description of the Related Art

In recent years, semiconductor devices are necessary for our daily life. Semiconductor elements, such as thin film transistors, included in semiconductor devices are manufactured in such a manner that a semiconductor film is formed over a substrate and the semiconductor film is processed into a desired shape by a photolithography method or the like. Such a manufacturing method is also used for liquid crystal display devices (e.g., liquid crystal television sets), for example.

Thin film transistors of conventional liquid crystal television sets often include amorphous silicon as semiconductor films. This is because, in general, thin film transistors including amorphous silicon films can be relatively formed with ease.

As a structure of thin film transistors including amorphous silicon films, an inverted-staggered structure is widely used. A thin film transistor with an inverted-staggered structure needs fewer masks to be manufactured than thin film transistors with another structure, and accordingly, the process is simple; therefore, an inverted-staggered structure is especially advantageous in cost.

Further, a technique in which a multi-tone mask (a half-tone mask or a gray-tone mask) is used for reducing the number of masks is widely known (e.g., Patent Document 1).

REFERENCE

[Patent Document 1] Japanese Published Patent Application No. 2009-055013

SUMMARY OF THE INVENTION

Even in the case of a thin film transistor with an inverted-staggered structure, when an active matrix substrate of a liquid crystal display device is manufactured, for example, five masks are needed until a pixel electrode is formed. That is to say, a gate electrode is formed with the use of a first mask provided over a conductive film; a semiconductor film is processed to have an island shape with the use of a second mask provided over the semiconductor film; a source electrode and a drain electrode are formed and channel etching is performed with the use of a third mask provided over another conductive film; an opening in which any one of the source electrode and the drain electrode is connected to the pixel electrode is formed with the use of a fourth mask provided over a passivation film; and the pixel electrode is formed with the use of a fifth mask provided over a transparent conductive film.

Further, a multi-tone mask needs a relatively sophisticated manufacturing technique, and therefore, is expensive. Accordingly, there is a demand for reducing the number of masks, using as fewer multi-tone masks as possible.

It is an object of an embodiment of the present invention to provide a method for manufacturing a semiconductor device with fewer masks, without a multi-tone mask, and in a simple process.

An embodiment of the present invention is a method for manufacturing a semiconductor device in which a process for processing a semiconductor film with the use of the second mask to have an island shape is omitted, and the semiconductor film is processed to have an island shape when an opening is formed in a passivation film with the use of the fourth mask.

An embodiment of the present invention is a method for manufacturing a semiconductor device by the following steps: a gate electrode is formed; a gate insulating film, a semiconductor film, an impurity semiconductor film, and a conductive film are stacked in this order, covering the gate electrode; a source electrode and a drain electrode is formed by processing the conductive film; a source region, a drain region, and a semiconductor layer, an upper part of a portion of which does not overlap with the source region and the drain region is removed, are formed by processing the upper part of the semiconductor film, while the impurity semiconductor film is divided; a passivation film over the gate insulating film, the semiconductor layer, the source region, the drain region, the source electrode, and the drain electrode are formed; an etching mask over the passivation film is formed; the passivation film, the semiconductor layer, and the gate insulating film are processed to have an island shape, while an opening reaching the source electrode or the drain electrode is formed, with the use of the etching mask; the etching mask is removed; and an electrode over the gate insulating film and the passivation film are formed.

The gate insulating film is not necessarily processed when the passivation film and the semiconductor layer are processed to have an island shape. Accordingly, an embodiment of the present invention is a method for manufacturing a semiconductor device by the following steps: a gate electrode is formed; a gate insulating film, a semiconductor film, an impurity semiconductor film, and a conductive film are stacked in this order, covering the gate electrode; a source electrode and a drain electrode is formed by processing the conductive film; a source region, a drain region, and a semiconductor layer, an upper part of a portion of which does not overlap with the source region and the drain region is removed, are formed by processing the upper part of the semiconductor film, while the impurity semiconductor film is divided; a passivation film over the gate insulating film, the semiconductor layer, the source region, the drain region, the source electrode, and the drain electrode are formed; an etching mask over the passivation film is formed; the passivation film and the semiconductor layer are processed to have an island shape while an opening reaching the source electrode and the drain electrode is formed, with the use of the etching mask; the etching mask is removed; and an electrode over the gate insulating film and the passivation film are formed.

In the structure, a passivation film is preferably provided over the electrode.

In the structure, the gate electrode is formed over a substrate provided with a base film. In the case where the substrate is a glass substrate, an impurity included in the substrate can be prevented from entering a semiconductor layer. In particular, in the case where the gate insulating film is etched in a process of etching the passivation film and the semiconductor layer, the substrate is exposed and further etched when a base film is not provided for the substrate. Therefore, it is advantageous to provide a base film.

In the structure, a portion connected to an external terminal can be formed in such a manner that the gate electrode is formed over a substrate, and after the electrode is formed, part of an end portion of the substrate is soaked in an etchant for etching the gate insulating film and the passivation film, and a terminal electrode formed using the same layer as the gate electrode is exposed.

In the structure, it is preferable that after the passivation film and the semiconductor layer are processed to have an island shape, insulation treatment be performed on an exposed portion of the island-shaped semiconductor layer. An impurity or the like can be prevented from entering an exposed portion of the semiconductor layer.

In the structure, the insulation treatment can be used as oxidation treatment using oxygen plasma.

In the structure, it is preferable that the semiconductor film be a stacked semiconductor film in which a semiconductor film including an amorphous part is formed on a crystalline semiconductor film. This is because on-state current can be high by a crystalline semiconductor film and an off-state current can be low by a semiconductor film including an amorphous part.

Note that in this specification, a pixel transistor is given as an example of a transistor when a semiconductor device is described; however, an embodiment of the present invention is not limited thereto. A semiconductor device which is an embodiment of the present invention may be a transistor except for a pixel transistor or a device including a transistor except for a pixel transistor.

Note that in this specification, a film is to be processed in a later step and is roughly uniformly formed over a surface. A layer is a processed film or is roughly uniformly formed over a surface and does not need to be processed in a later step.

According to an embodiment of the present invention, a semiconductor device can be manufactured with fewer masks, without a multi-tone mask, and in a simple process.

DETAILED DESCRIPTION OF THE INVENTION

Figure 1A:
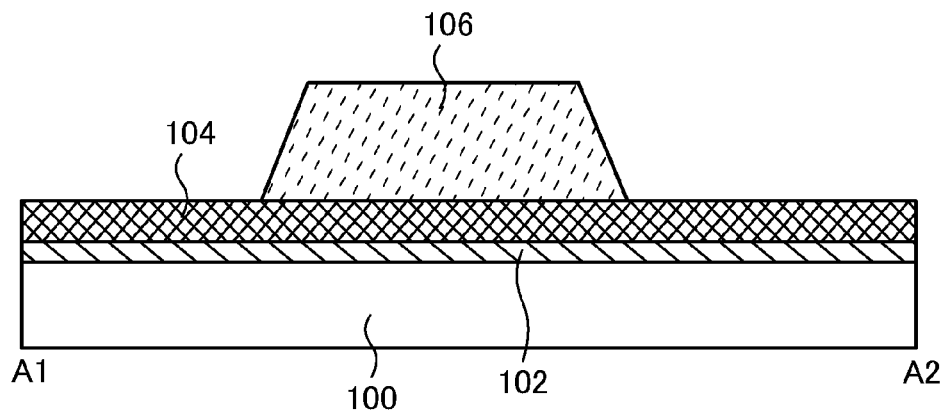
FIGS. 1A to 1C are cross-sectional views illustrating a method for manufacturing a semiconductor device that is an embodiment of the present invention.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

First, a method for manufacturing a semiconductor device (an active matrix substrate of a liquid crystal display device) that is an embodiment of the present invention will be described. Note that in the following description, a liquid crystal display device is described as one of semiconductor devices, for example. However, an embodiment of the present invention is not limited thereto. The following manufacturing method may be used for manufacturing an EL display device, for example.

First, a base film 102 is formed over a substrate 100. Note that there is no limitation to be this. The base film 102 does not have to be provided when not necessary; for example, in the case where the substrate 100 is a quartz substrate.

The substrate 100 is an insulating substrate. As the substrate 100, in addition to a glass substrate, a quartz substrate and a ceramic substrate, a plastic substrate or the like with heat resistance that is high enough to withstand a process temperature in this manufacturing process can be used. When the substrate 100 is a glass substrate, the substrate may have any size of the first generation (e.g., 320 mm×400 mm) to the tenth generation (e.g., 2950 mm×3400 mm); however, the substrate is not limited thereto.

As the base film 102, an insulating material (e.g., silicon nitride, silicon nitride oxide, silicon oxynitride, or silicon oxide) film may be formed by a plasma CVD method, for example. Note that the base film 102 may have a single-layer structure or a stacked structure including a plurality of layers; for example, the base film 102 is a silicon nitride layer.

"Silicon nitride oxide" contains more nitrogen than oxygen and, in the case where measurements are performed using Rutherford backscattering spectrometry (RBS) and hydrogen forward scattering (HFS), preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

"Silicon oxynitride" contains oxygen and nitrogen so that the oxygen content is higher than the nitrogen content, and in the case where measurements are performed using RBS and HFS, preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

Next, a first conductive film 104 is formed over the base film 102.

The first conductive film 104 is a metal film formed by a sputtering method, a semiconductor film to which an impurity element imparting one conductivity type, or the like. Note that the conductive film to be the first conductive film 104 may be formed to have a single-layer structure or a stacked structure including a plurality of layers. For example, the conductive film may be formed to have a three-layer structure in which an Al layer is sandwiched between Ti layers.

Next, a first etching mask 106 is formed over the first conductive film 104 (FIG. 1A).

In order to form the first etching mask 106, a resist material is formed over the entire surface and a pattern may be formed by a photolithography method. Here, a resist material is formed over the entire surface of the first conductive film 104, and the first etching mask 106 may be formed by a photolithography method.

Figure 1B:
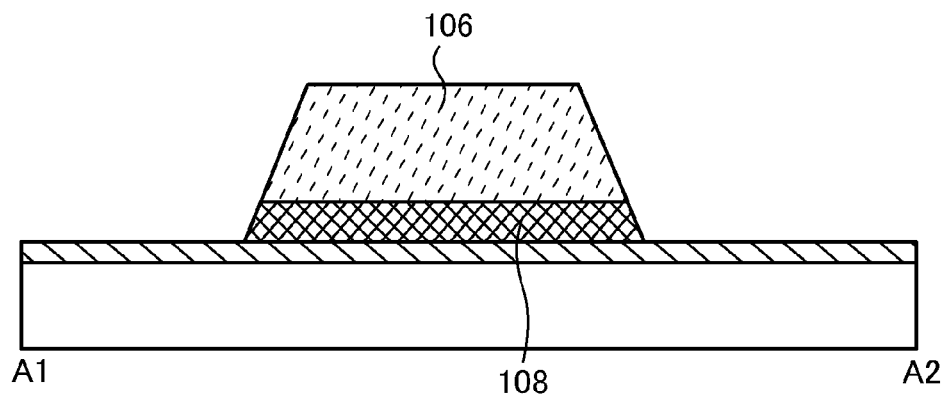

Next the first conductive film 104 is etched with the use of the first etching mask 106 to form a first conductive layer 108 (FIG. 1B). The first conductive layer 108 serves as at least a gate electrode and a gate wiring.

Then, the first etching mask 106 is removed.

A first insulating film 110 is formed to cover the first conductive layer 108. Note that the first insulating film 110 serves as at least a gate insulating film.

The first insulating film 110, for example, can be formed using an insulating material by a plasma CVD method. Note that the first insulating film 110 may be formed to have a single layer structure or a stacked structure including a plurality of layers. A two-layer structure in which a silicon oxynitride layer is stacked over a silicon nitride layer is employed here, for example.

Note that at this point, a surface of the first insulating film 110 is preferably exposed to plasma generated using an $N_2O$ gas. This is because the surface of the first insulating film 110 is oxidized by the exposure, whereby the crystallinity of the first semiconductor film 112 formed over the first insulating film 110 can be improved. The gas used for generating plasma is not limited to an $N_2O$ gas, and a gas that can oxidize the surface of the first insulating film 110 (an oxidation gas or a gas containing oxygen) can be used.

Next, the first semiconductor film 112 is formed over the first insulating film 110.

The first semiconductor film 112 is formed using a semiconductor material having high carrier mobility, and preferably formed using a crystalline semiconductor. As the crystalline semiconductor, a microcrystalline semiconductor is given, for example. Here, a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of 2 nm or more and 200 nm or less, preferably 10 nm or more and 80 nm or less, further preferably 20 nm or more and 50 nm or less have grown in a direction normal to the substrate surface. Thus, there is a case where crystal grain boundaries are formed at the interface of the columnar or needle-like crystal grains. Note that the diameter of the grain here means the maximum diameter of the crystal grain in a plane parallel to the substrate surface. Further, the crystal grain includes an amorphous semiconductor region and a crystallite which is a minute crystal that can be regarded as a single crystal. Note that the crystal grain may include a twin crystal.

As the microcrystalline semiconductor, microcrystalline silicon may be used. Microcrystalline silicon which is one of microcrystalline semiconductors has a peak of Raman spectrum which is shifted to a lower wave number than 520 $cm^{-1}$ that represents single crystal silicon. That is, the peak of the Raman spectrum of the microcrystalline silicon exists between 520 $cm^{-1}$ which represents single crystal silicon and 480 $cm^{-1}$ which represents amorphous silicon. Further, the microcrystalline silicon contains hydrogen or halogen of at least 1 at. % in order to terminate a dangling bond. Furthermore, the microcrystalline silicon contains a rare gas element such as He, Ar, Kr, or Ne to further promote lattice distortion, so that stability is increased and a favorable microcrystalline semiconductor can be obtained.

Moreover, when the concentration of oxygen and nitrogen contained in the crystalline semiconductor film (measured by secondary ion mass spectrometry) is lowered, preferably set to less than $1 \times 10^{18}$ $cm^{-3}$, the crystallinity of the crystalline semiconductor film can be increased.

A second semiconductor film 114 is formed over the first semiconductor film 112.

The second semiconductor film 114 may be formed using a semiconductor material having lower carrier mobility than that of the first semiconductor film 112 in order to serve as a buffer layer, and preferably includes an amorphous semiconductor and a minute semiconductor crystal grain. In addition, the second semiconductor film 114 has lower energy at the Urbach edge, which is measured by a constant photocurrent method (CPM) or photoluminescence spectrometry, and a smaller amount of defect absorption spectrum, as compared to a conventional amorphous semiconductor. As compared to the conventional amorphous semiconductor film, such a semiconductor film is a well-ordered semiconductor film which has few defects and a steep tail slope of a level at a band edge (a mobility edge) in the valence band. Such a semiconductor film is referred to as "a semiconductor film including an amorphous part".

The second semiconductor film 114 may include at least one of halogen and nitrogen. In the case where the second semiconductor film 114 includes nitrogen, the nitrogen may be included as an NH group or an $NH_2$ group.

Note that here, an interface region between the first semiconductor film 112 and the second semiconductor film 114 includes microcrystalline semiconductor regions and amorphous semiconductor regions between the microcrystalline semiconductor regions. Specifically, the interface region between the first semiconductor film 112 and the second semiconductor film 114 includes a microcrystalline semiconductor region which extends in a conical or pyramidal shape from the first semiconductor film 112 and "a semiconductor region including an amorphous part" which is similar to the second semiconductor film 114.

Since the second semiconductor film 114 serves as a buffer layer, the off-state current of a transistor can be reduced. Further, since the interface region has the conical or pyramidal microcrystalline semiconductor regions, resistance in the vertical direction (the film thickness direction), that is, resistance between the second semiconductor film 114 and a source region or a drain region formed of the impurity semiconductor film 116, can be lowered. Thus, the on-state current of the transistor can be increased. In this manner, as compared to the case of using the conventional amorphous semiconductor, the off-state current can be sufficiently reduced and reduction in on-state current can be suppressed; thus, switching characteristics of the transistor can be improved.

Note that when a first semiconductor layer formed from the first semiconductor film 112 is thinned in the completed transistor, the on-state current is decreased. When the first semiconductor layer formed from the first semiconductor film 112 is thickened in the completed transistor, a contact area between the first semiconductor layer formed from the first semiconductor film 112 and a second conductive layer is increased and thus the off-state current is increased. Therefore, in order to increase the ON/OFF ratio, it is preferable to make the first semiconductor film 112 thicker, and further apply an insulation treatment to sidewalls of a thin film laminated body including the first semiconductor layer formed from the first semiconductor film 112 as described later.

A large portion of the above microcrystalline semiconductor region preferably includes crystal grains having a conical or pyramidal shape whose top gets narrower from the first semiconductor film 112 toward the second semiconductor film 114. Alternatively, a large portion of the above microcrystalline semiconductor region may include crystal grains having a conical or pyramidal shape whose top gets wider from the first semiconductor film 112 toward the second semiconductor film 114.

In the above interface region, when the microcrystalline semiconductor region includes crystal grains having a conical or pyramidal shape whose top gets narrower from the first semiconductor film 112 toward the second semiconductor film 114, the proportion of the microcrystalline semiconductor region on the first semiconductor film 112 side is higher than that on the second semiconductor film 114 side. The microcrystalline semiconductor region grows from the surface of the first semiconductor film 112 in the thickness direction. When the flow rate of hydrogen with respect to a deposition gas (for example, silane) is low (that is, the dilution ratio is low) in a raw material gas, or when the concentration of a raw material gas containing nitrogen is high, the crystal growth is suppressed in the microcrystalline semiconductor region to provide crystal grains in a conical shape, with the result that the semiconductor formed by deposition is mostly an amorphous semiconductor.

The above interface region preferably contains nitrogen, in particular, an NH group or an $NH_2$ group. This is because defects are reduced and carriers flow easily when nitrogen, in particular, an NH group or an $NH_2$ group is bonded with dangling bonds of silicon atoms at an interface of crystal included in the microcrystalline semiconductor region or at an interface between the microcrystalline semiconductor region and the amorphous semiconductor region. Accordingly, by setting the concentration of nitrogen, preferably, an NH group or an $NH_2$ group to $1 \times 10^{20}$ $cm^{-3}$ to $1 \times 10^{21}$ $cm^{-3}$, the dangling bonds of silicon atoms can be easily cross-linked with nitrogen, preferably an NH group or an $NH_2$ group, so that carriers can flow easily. As a result, a bond which promotes the carrier transfer is formed at a crystal grain boundary or a defect, whereby the carrier mobility of the interface region is increased. Therefore, the field effect mobility of the transistor is improved.

Further, when the concentration of oxygen in the interface region is reduced, defect density at the interface between the microcrystalline semiconductor region and the amorphous semiconductor region or the interface between crystal grains can be reduced, so that bonds which inhibit carrier transfer can be reduced.

Next the impurity semiconductor film 116 is formed over the second semiconductor film 114.

The impurity semiconductor film 116 is formed using a semiconductor to which an impurity element imparting one conductivity type is added. When the transistor is an n-channel transistor, silicon to which phosphorus (P) or arsenic (As) is added is given as a semiconductor to which the impurity element imparting one conductivity type is added, for example. Meanwhile, when the transistor is a p-channel transistor, for example, boron (B) may be added as the impurity element imparting one conductivity type. Note that it is preferable that the transistor be an n-channel transistor. Therefore, for example, silicon to which P is added is used here. The impurity semiconductor film 116 may be formed using an amorphous semiconductor or a crystalline semiconductor such as a microcrystalline semiconductor.

Note that it is preferable that from the first insulating film 110, the first semiconductor film 112, the second semiconductor film 114, and the impurity semiconductor film 116 be formed successively in one chamber. This is because an interface between the first insulating film 110 and the first semiconductor film 112, an interface between the first semiconductor film 112 and the second semiconductor film 114, and an interface between the second semiconductor film 114 and the impurity semiconductor film 116 are prevented from containing an impurity.

Next, a second conductive film 118 is formed over the impurity semiconductor film 116.

The second conductive film 118 may be formed using a conductive material, like the first conductive film 104. Note that the second conductive film 118 may be formed to have either a single-layer structure or a stacked structure including a plurality of layers. The second conductive film 118 is formed to have a three-layer structure in which an Al layer is sandwiched between Ti layers, for example.

Figure 1C:
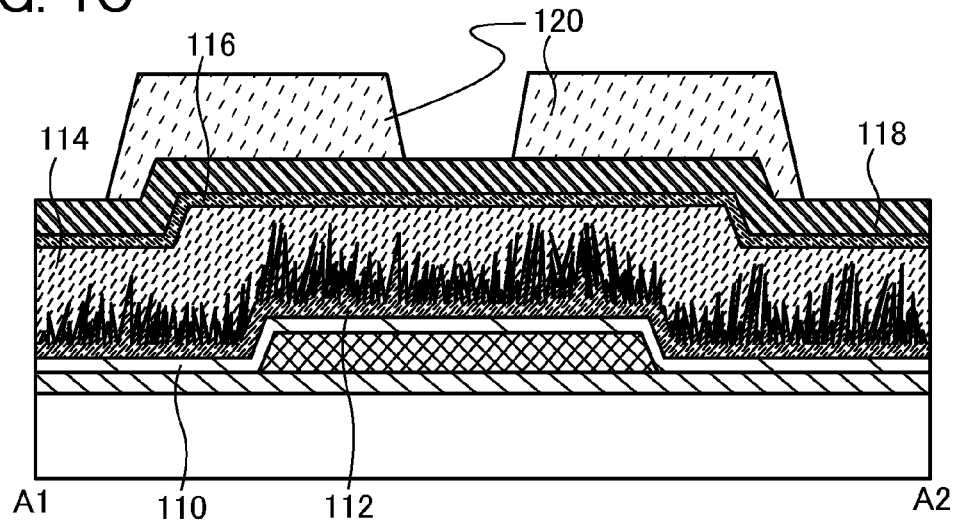

Next, a second etching mask 120 is formed over the second conductive film 118 (FIG. 1C).

In order to form the second etching mask 120, a resist material is formed over the entire surface and a pattern may be formed by a photolithography method, like the first etching mask 106. Here, a resist material is formed over the entire surface of the second conductive film 118, and the second etching mask 120 may be formed by a photolithography method.

Figure 2A:
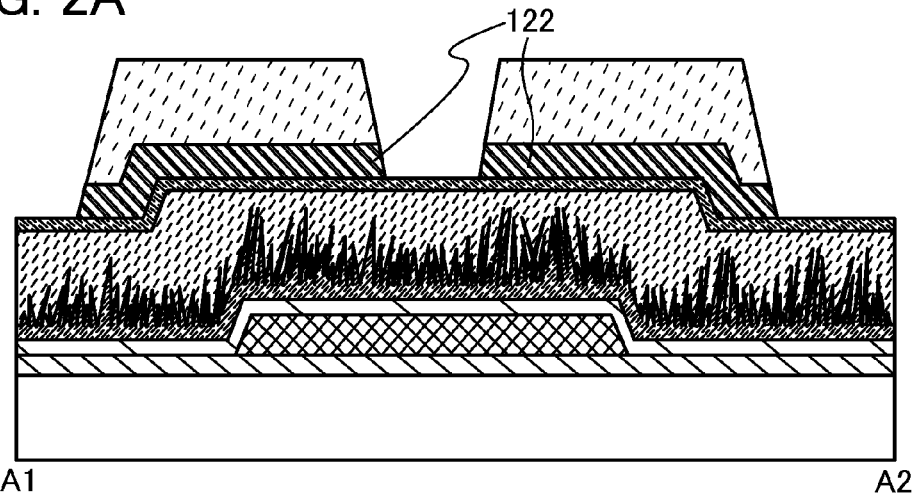
FIGS. 2A to 2C are cross-sectional views illustrating a method for manufacturing a semiconductor device that is an embodiment of the present invention.

Next, the second conductive film 118 is etched with the use of the second etching mask 120 to form a second conductive layer 122 (FIG. 2A). The second conductive layer 122 serves as at least a source electrode, a drain electrode, and a source wiring. Note that for the etching, dry etching using a gas including fluorine or chlorine can be employed.

Figure 2B:
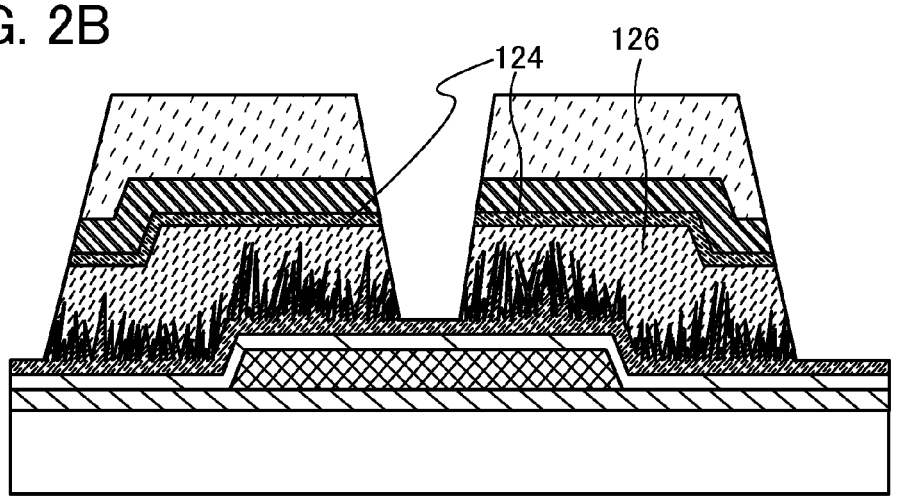

The impurity semiconductor film 116 and the second semiconductor film 114 are etched with the use of the second etching mask 120, whereby an impurity semiconductor layer 124 and a second semiconductor layer 126 are formed. Etching is performed to expose and leave part of the first semiconductor film 112, which does not overlap with the second etching mask 120 (FIG. 2B). Note that for the etching, dry etching using a gas including fluorine or chlorine can be employed.

Alternatively, the impurity semiconductor film 116 may be etched with the use of the second etching mask 120 to leave the second semiconductor film 114. Etching may be performed to leave part of the first semiconductor film 112, which does not overlap with the second etching mask 120.

Note that a process for forming the second conductive layer 122 and a process for forming the impurity semiconductor layer 124 and the second semiconductor layer 126 may be concurrently performed. Each of these processes is preferably an etching process have two steps: a first etching using a mixed gas of a $BCl_3$ gas and a $Cl_2$ gas and a second etching using a $CF_4$ gas.

Then, the second etching mask 120 is removed.

Next, a second insulating film 128 is formed over the etched first semiconductor film 112, the second semiconductor layer 126, the impurity semiconductor layer 124, and the second conductive layer 122.

The second insulating film 128 may be formed using an insulating material, like the first insulating film 110. Note that the second insulating film 128 may have a single-layer structure or a stacked structure including a plurality of layers. For example, the second insulating film 128 may be formed using silicon nitride, here.

Figure 2C:
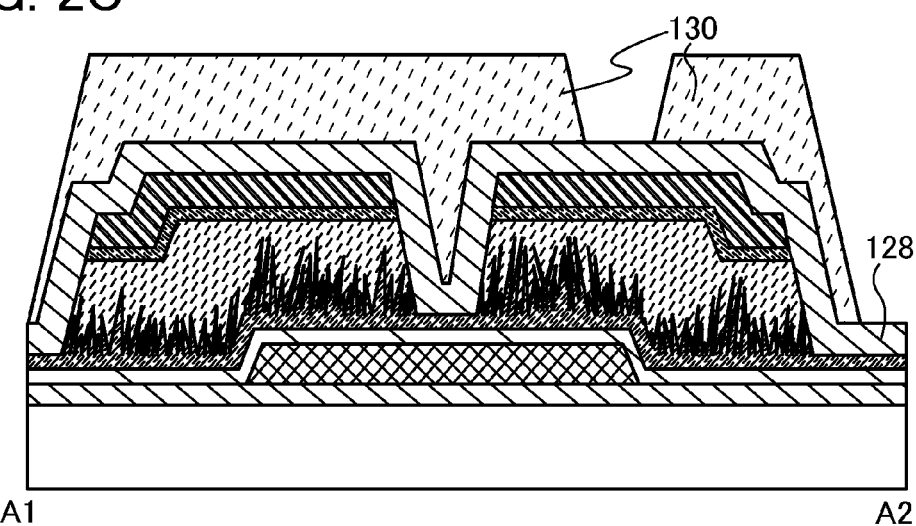

Next, a third etching mask 130 is formed over the second insulating film 128 (FIG. 2C).

In order to form the third etching mask 130, a resist material is formed over the entire surface and a pattern may be formed by a photolithography method, like the first etching mask 106. Here, a resist material is formed over the entire surface of the second insulating film 128, and the third etching mask 130 may be formed by a photolithography method.

Figure 3A:
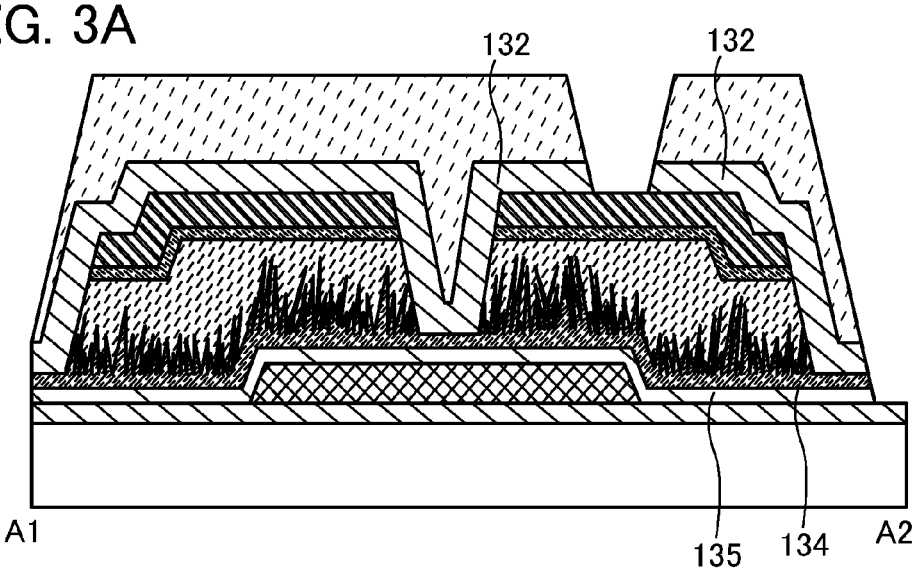
FIGS. 3A to 3C are cross-sectional views illustrating a method for manufacturing a semiconductor device that is an embodiment of the present invention.

The second insulating film 128 is etched with the use of the third etching mask 130 to form a second insulating layer 132 (FIG. 3A). Etching is performed to expose part of the second conductive layer 122 which does not overlap with the third etching mask 130.

Here, part of the etched first semiconductor film 112, which does not overlap with the third etching mask 130, is etched to form an island-shaped first semiconductor layer 134. Further, the first insulating film 110 is etched to form a first insulating layer 135 (FIG. 3A).

A process in which part of the etched first semiconductor film 112, which does not overlap with the third etching mask 130, and the first insulating film 110 are etched to form the first semiconductor layer 134 and a first insulating layer 135 is preferably a four-stage etching process including the following processes: a first etching with the use of a mixed gas of a $CHF_3$ gas and a He gas, a second etching with the use of a $CF_4$ gas, a third etching with the use of a mixed gas of a HBr gas, a $CF_4$ gas, and an $O_2$ gas, and a fourth etching with the use of a mixed gas of a $CHF_3$ gas and a He gas. Alternatively, a $SF_6$ gas may be used instead of a $CF_4$ gas.

Note that as described above, insulation treatment is preferably performed on a sidewall of a thin film stack including the first semiconductor layer 134 after the processes. That is because, in many cases, the off-state current increases when the first semiconductor layer and the second conductive layer of the completed transistor are in contact with each other. As the insulation treatment, the following treatment can be performed: a treatment in which the sidewalls of the thin film stack are exposed to oxygen plasma or nitrogen plasma, or a treatment in which an insulating film is formed while the side surfaces of the thin film stack are exposed, and the insulating film is etched in the direction perpendicular to a surface of the substrate 100 by an etching method with high anisotropy so as to form sidewall insulating layers in contact with the side surfaces of the thin film stack.

Then, the third etching mask 130 is removed.

Next, a third conductive film 136 is formed over the first insulating layer 135 and the second insulating layer 132.

The third conductive film 136 can be formed using a conductive composition containing a conductive high molecule (also referred to as a conductive polymer) having a light-transmitting property. It is preferable that the third conductive film 136 formed using a conductive composition have a sheet resistance of less than or equal to 10000 Ω/square and a light transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called π electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The third conductive film 136 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Figure 3B:
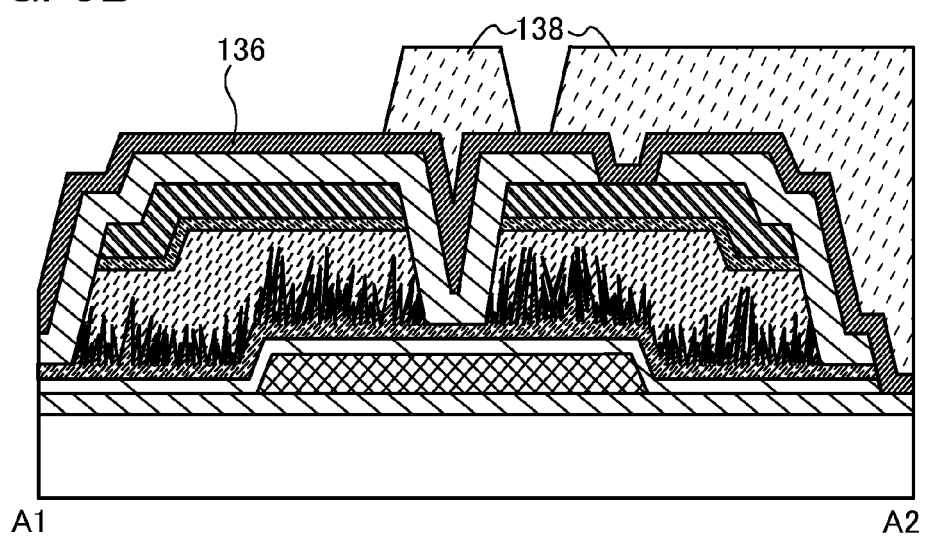

Next, a fourth etching mask 138 is formed over the third conductive film 136 (FIG. 3B).

In order to form the fourth etching mask 138, like the first etching mask 106, a resist material is formed over the entire surface and a pattern may be formed by a photolithography method. Here, a resist material is formed over the entire surface of the third conductive film 136, and the fourth etching mask 138 may be formed by a photolithography method.

Figure 3C:
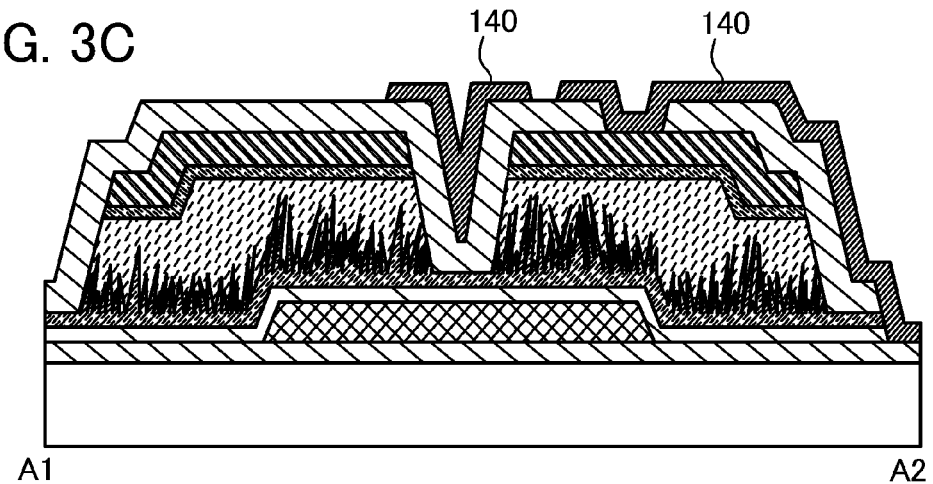

The third conductive film 136 is etched with the use of the fourth etching mask 138 to form a third conductive layer 140 (FIG. 3C). The third conductive layer 140 serves as at least a pixel electrode.

Difference in height between a region where the first conductive layer 108 and the third conductive layer 140 are in contact with each other and a region where adjacent source electrode and drain electrode are provided is extremely large. A post spacer (columnar spacer) may be formed in the region where the first conductive layer 108 and the third conductive layer 140 are in contact with each other. Note that in the case of an EL display device, a bank portion for separately forming a light-emitting layer for each color may be provided in the region where the first conductive layer 108 and the third conductive layer 140 are in contact with each other.

In the case where the third conductive film 136 is formed using ITO, since sodium and the like contained in a glass substrate can be blocked, an etched portion is minimized and a region of the third conductive layer 140 may be made wide when the third conductive film 136 is etched to form the third conductive layer 140. Further, for example, in the case where the uppermost layer of the second conductive layer 122 is formed using Ti, when oxygen plasma treatment as insulation treatment is performed on a sidewall of a thin film stack including the first semiconductor layer 134, a titanium oxide layer is formed in a contact portion between the second conductive layer 122 and the third conductive layer 140, causing an increase in contact resistance. Therefore, when heating is performed at approximately 250° C. after an ITO film is formed as the third conductive film 136, an increase in contact resistance can be suppressed.

Note that here, illustrated is an embodiment of a dual gate thin film transistor in which a back gate electrode is formed using the third conductive layer 140 and the first conductive layer 108 and the third conductive layer 140 are connected to each other. When a back gate electrode is thus included, on-state current of a thin film transistor can be increased.

Alternatively, a back gate electrode may be formed using the third conductive layer 140 but the first conductive layer 108 and the third conductive layer 140 are not necessarily connected to each other. At this time, a potential of the back gate electrode which is formed using the third conductive layer 140 is different from a potential of the gate electrode which is formed using the first conductive layer 108. In this case, on-state current of a thin film transistor can be increased, and the threshold voltage of the thin film transistor can be controlled.

Further alternatively, a back gate electrode may be formed using a layer other than the third conductive layer 140 and the first conductive layer 108 and the third conductive layer 140 may be connected to each other. When the back gate electrode is thus included, on-state current of a thin film transistor can be increased.

Still alternatively, a back gate electrode may be formed using a layer other than the third conductive layer 140, but the first conductive layer 108 and the third conductive layer 140 are not necessarily connected to each other. When the back gate electrode is thus included, on-state current of a thin film transistor can be increased, and the threshold voltage of the thin film transistor can be controlled.

Note that an embodiment of the present invention is not limited thereto, and a back gate electrode is not necessarily provided.

Figure 6:
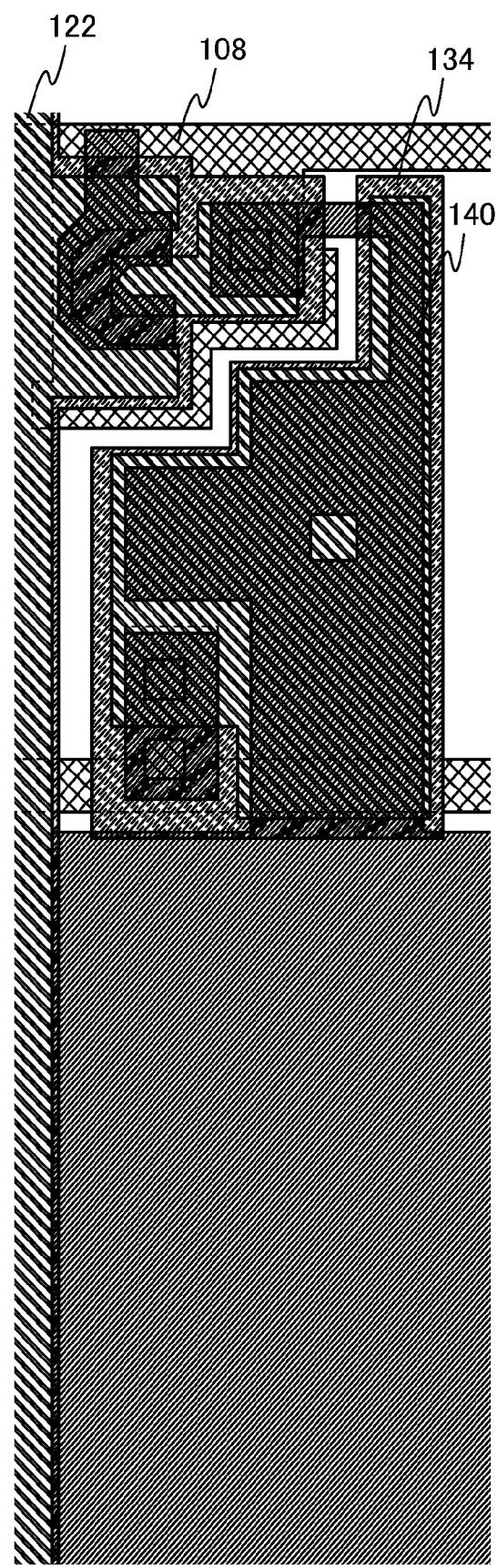
FIG. 6 is a top view illustrating a method for manufacturing a semiconductor device that is an embodiment of the present invention.

As described above, layers up to and including the pixel electrode can be formed using four masks without using a multi-tone mask. FIG. 6 illustrates an example of a top view (layout diagram) of the completed semiconductor device. Although not illustrated, in an embodiment of the present invention, a black matrix layer in which an opening is formed only in a transmissive region is preferably provided. Here, the black matrix layer is preferably formed using an organic resin.

Alternatively, the second insulating layer 132 serving as a passivation layer and the first semiconductor layer 134 may be processed to have a step. The manufacturing method in this case will be described below.

First, as in the manufacturing method described above, the second insulating film 128 is etched with the use of the third etching mask 130 to form the second insulating layer 132, and then, the island-shaped first semiconductor layer 134 and the first insulating layer 135 are formed (FIG. 3A).

A process in which the second insulating film 128 is etched with the use of the third etching mask 130 to form a second insulating layer 132 and the island-shaped first semiconductor layer 134 and the first insulating layer 135 is preferably a four-stage etching process including the following processes: a first etching with the use of a mixed gas of a $CHF_3$ gas and a He gas, a second etching with the use of a $CF_4$ gas, a third etching with the use of a mixed gas of a HBr gas, a $CF_4$ gas, and an $O_2$ gas, and a fourth etching with the use of a mixed gas of a $CHF_3$ gas and a He gas. Alternatively, a $SF_6$ gas may be used instead of a $CF_4$ gas.

Figure 4A:
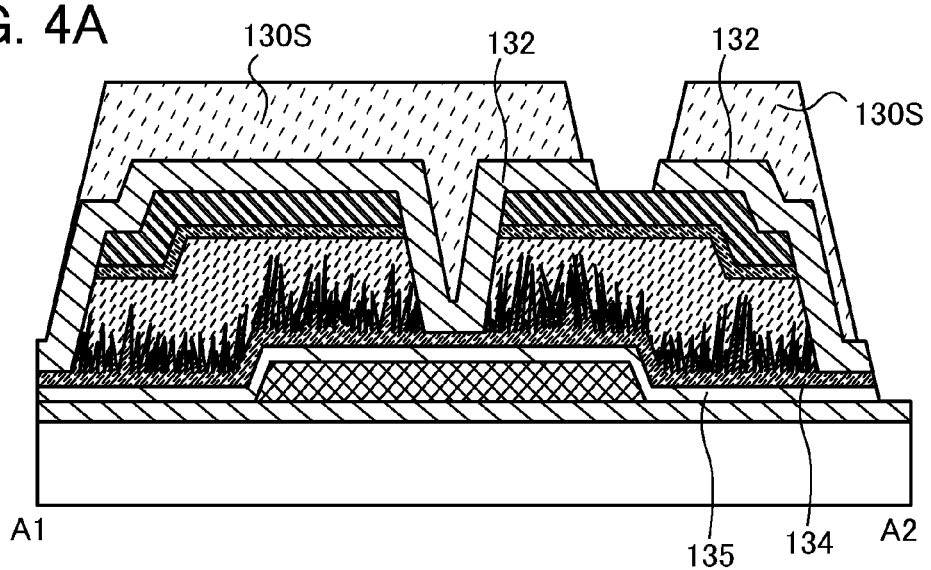
FIGS. 4A to 4C are cross-sectional views illustrating a method for manufacturing a semiconductor device that is an embodiment of the present invention.

After the above step, the third etching mask 130 is reduced, whereby a reduced etching mask 130S is formed (FIG. 4A). As a method for reducing the third etching mask 130, ashing using oxygen plasma may be employed.

Figure 4B:
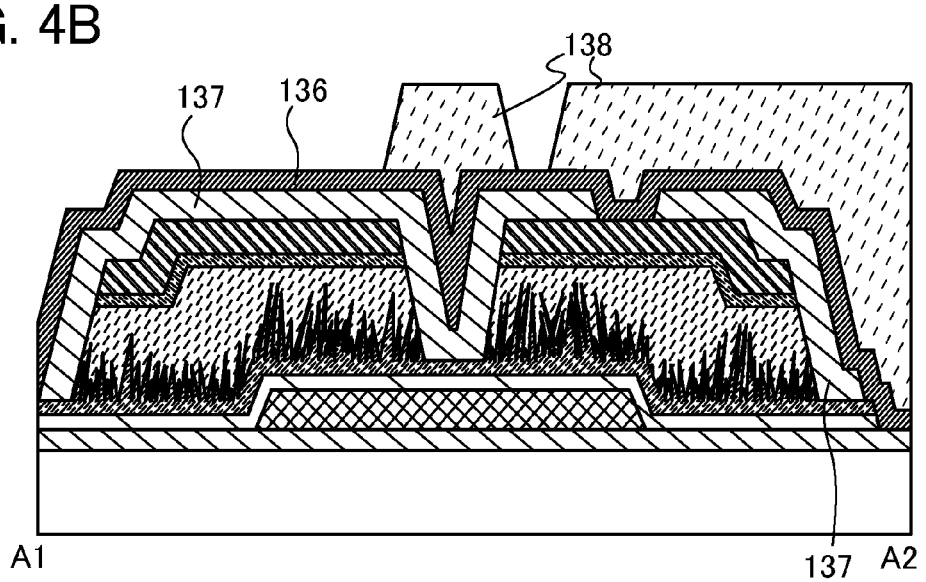

Next, the second insulating layer 132 is etched with the use of the reduced etching mask 130S to form a second insulating layer 137 (FIG. 4B).

This step is preferably an etching step using a mixed gas of a $CHF_3$ gas and a He gas.

Note that in a manner similar to the manufacturing method described above, insulation treatment is preferably performed on a sidewall of a thin film stack including the first semiconductor layer 134.

Next, the reduced etching mask 130S is removed, and the third conductive film 136 is formed over the base film 102 and the second insulating layer 137. Then, the fourth etching mask 138 is formed over the third conductive film 136 (FIG. 4B).

Figure 4C:
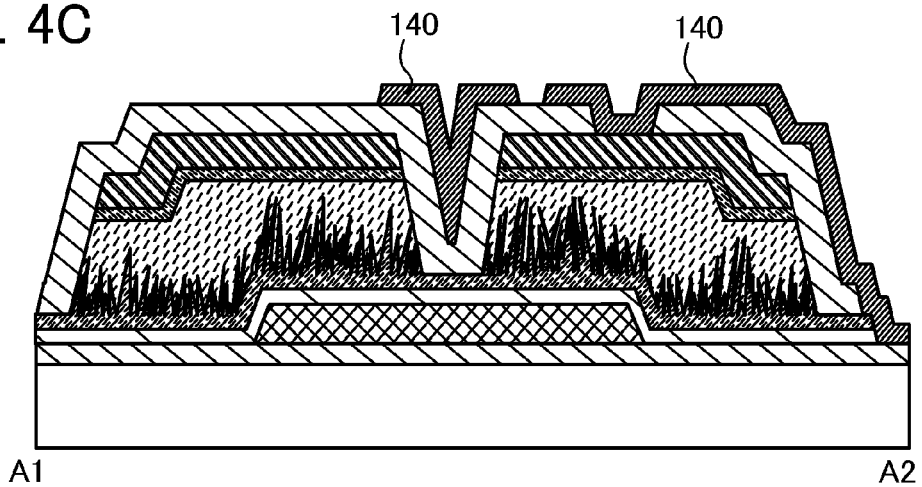

Next, the third conductive film 136 is etched with the use of the fourth etching mask 138 to form the third conductive layer 140 (FIG. 4C). The third conductive layer 140 serves as at least a pixel electrode.

As described above, the second insulating layer 137 serving as a passivation layer and the first semiconductor layer 134 can be made to have a step without an increase in the number of masks. When the second insulating layer 137 serving as a passivation layer and the first semiconductor layer 134 have a step, rubbing treatment can be favorably performed with less unevenness on an alignment film formed in a later step.

Note that after the layers up to and including the third conductive layer 140 are formed, another passivation film may be formed over the second insulating layer 137 and the third conductive layer 140.

Alternatively, the gate insulating film is not necessarily processed when the passivation film and the semiconductor layer are processed into island shapes. The manufacturing method in this case will be described below.

Figure 5A:
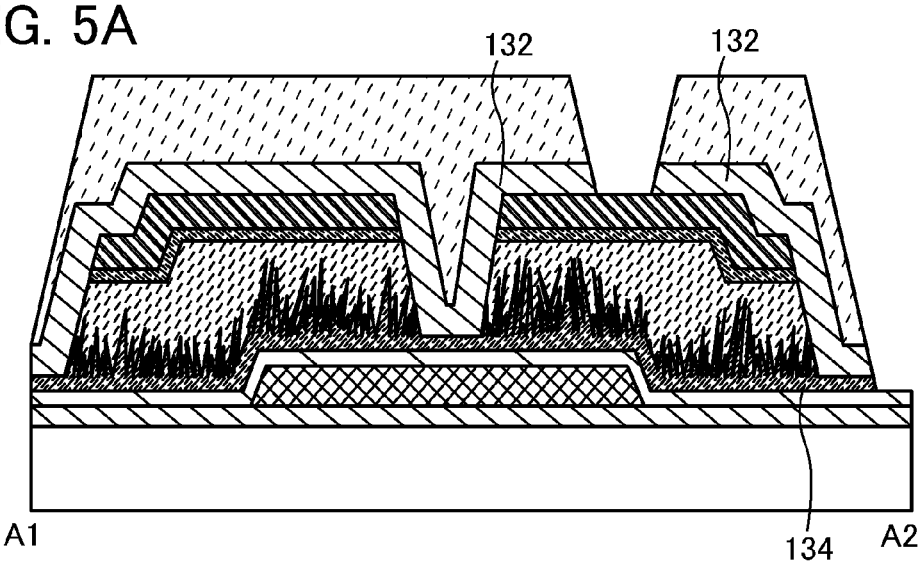
FIGS. 5A to 5C are cross-sectional views illustrating a method for manufacturing a semiconductor device that is an embodiment of the present invention.

First, in a manner similar to the manufacturing method described above, the second insulating film 128 is etched with the use of the third etching mask 130 to form the second insulating layer 132 (FIG. 5A). Etching is performed to expose part of the second conductive layer 122 which does not overlap with the third etching mask 130.

Here, part of the etched first semiconductor film 112, which does not overlap with the third etching mask 130, is etched to form the island-shaped first semiconductor layer 134 (FIG. 5A).

A process in which part of the etched first semiconductor film 112, which does not overlap with the third etching mask 130, is also etched to form the island-shaped first semiconductor layer 134 is preferably a two-stage etching process including the following processes: a first etching with the use of a $CF_4$ gas, and a second etching with the use of a mixed gas of a HBr gas, a $CF_4$ gas, and an $O_2$ gas. Alternatively, a $SF_6$ gas may be used instead of a $CF_4$ gas.

Note that as described above, insulation treatment is preferably performed on a sidewall of a thin film stack including the first semiconductor layer 134 after the processes.

Then, the third etching mask 130 is removed.

Next, the third conductive film 136 is formed over the first insulating film 110 and the second insulating layer 132.

Figure 5B:
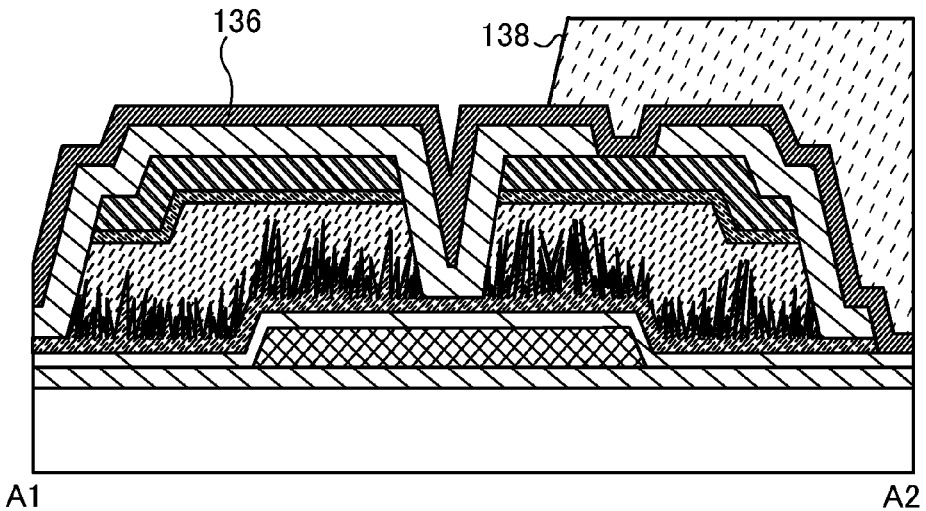

Next, the fourth etching mask 138 is formed over the third conductive film 136 (FIG. 5B).

In order to form the fourth etching mask 138, like the first etching mask 106, a resist material is formed over the entire surface and a pattern may be formed by a photolithography method. Here, a resist material is formed over the entire surface of the third conductive film 136, and the fourth etching mask 138 may be formed by a photolithography method.

Figure 5C:
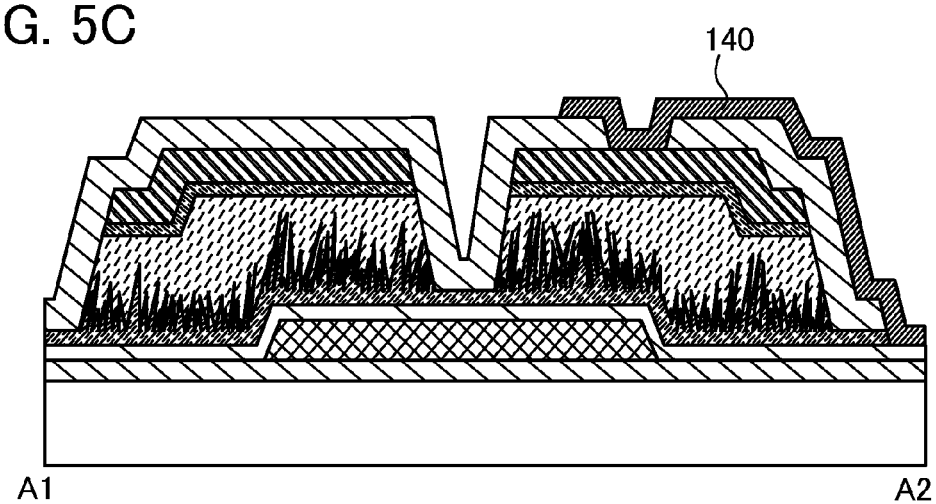

The third conductive film 136 is etched with the use of the fourth etching mask 138 to form the third conductive layer 140 (FIG. 5C). The third conductive layer 140 serves as at least a pixel electrode.

Note that a back gate electrode may be provided over a surface of the second insulating layer 132, which is opposite to the surface where the gate electrode formed using the first conductive layer 108 provided, so as to overlap with an exposed portion of the first semiconductor layer 134.

As described above, layers up to and including the pixel electrode can be formed using four masks without using a multi-tone mask.

Note that after the layers up to and including the third conductive layer 140 are formed, another passivation film may be formed over the second insulating layer 132 and the third conductive layer 140.

Note that the method for manufacturing a semiconductor device, which is an embodiment of the present invention, may be applied to a semiconductor device in which a first semiconductor layer is not provided. In other words, the method for manufacturing the semiconductor device, which is the embodiment of the present invention may be applied to a thin film transistor in which a semiconductor layer is formed using only an amorphous semiconductor layer.

As described above, in the manufactured active matrix substrate for a liquid crystal display device, the first conductive layer 108 serving as a gate electrode is covered with the insulating film in the entire region of the substrate. Therefore, it is difficult to input a signal to the first conductive layer 108 from the external. An example of a method in which a terminal electrode formed using the first conductive layer 108 is exposed will be described below.

In order to expose a terminal electrode, part of an end portion of the substrate 100 may be soaked in an etchant for removing the first insulating film 110 and the second insulating layer 132 after the third conductive layer 140 serving as a pixel electrode is formed.

Figure 7A:
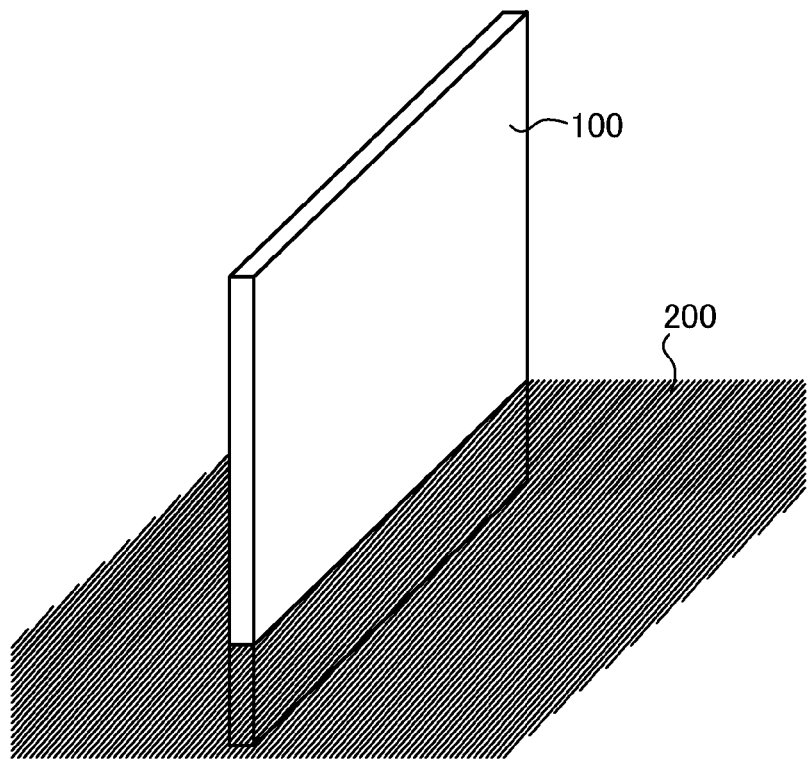
FIGS. 7A and 7B are diagrams illustrating a method for manufacturing a semiconductor device that is an embodiment of the present invention.
Figure 7B:
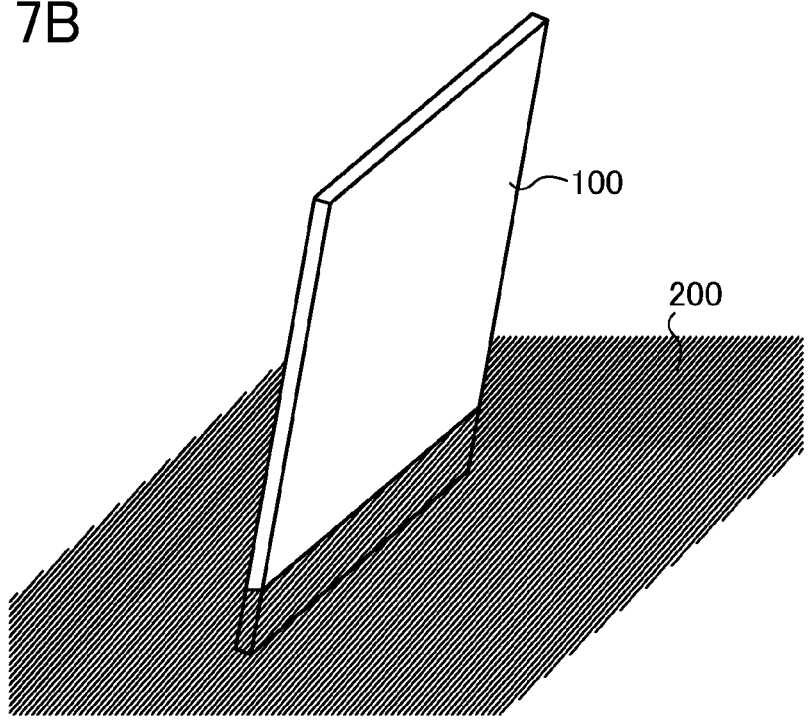

FIG. 7A shows a state in which part of an end portion of the substrate 100 is soaked in an etchant 200. Note that as illustrated in FIG. 7B, the tilted substrate 100 may be soaked in the etchant 200.

In the case where the first conductive layer 108 is formed using copper, diluted hydrofluoric acid may be used as the etchant 200.

Note that the method for manufacturing a semiconductor device, which is an embodiment of the present invention, is not limited to the one described in this embodiment, and a terminal electrode may be exposed by another method.

Here, a cross-sectional view of a liquid crystal display device in a state where an FPC is connected to an active matrix substrate in which a terminal electrode is exposed will be described. In other words, the active matrix substrate manufactured in the above-described manner is subjected to a cell process and a module process. Note that the cell process and the module process are not limited to the following description.

In the cell process, the active matrix substrate manufactured in the above-described steps and a substrate counter to the active matrix substrate (hereinafter referred to as a counter substrate) are attached to each other and a liquid crystal is injected therebetween. First, a method for manufacturing the counter substrate will be briefly described below. Note that a film formed over the counter substrate may have a single-layer structure or a stacked structure including a plurality of layers.

First, a light-blocking layer is formed over a substrate; a color filter layer of any of red, green, and blue is formed over the light-blocking layer; a pixel electrode layer is selectively formed over the color filter layer; and then, a rib is formed over the pixel electrode layer.

As the light-blocking layer, a film of a material having a light-blocking property is selectively formed. As the material having a light-blocking property, for example, an organic resin containing a black resin (carbon black) can be used. Alternatively, a stacked film which includes a chromium film or a film of a material containing chromium as its main component may be used. The film of a material containing chromium as its main component means a film containing chromium, chromium oxide, or chromium nitride. The material used for the light-blocking layer is not particularly limited as long as it has a light-blocking property. In order to selectively form the film of a material having a light-blocking property, a photolithography method or the like is employed.

The color filter layer may be selectively formed using an organic resin film which transmits only light with any of red, green, and blue when irradiated with white light from a backlight. The color filter layer can be selectively formed by selective formation of color materials. The arrangement of the color filter layer may be a stripe arrangement, a delta arrangement, or a square arrangement.

The pixel electrode layer over the counter substrate can be formed in a manner similar to that of the third conductive layer 140 serving as the pixel electrode of the active matrix substrate. Note that, since selective formation is not necessary, the pixel electrode layer may be formed over the entire surface of the counter substrate.

The rib formed over the pixel electrode layer is an organic resin film formed with a pattern for the purpose of widening the viewing angle. Note that the rib does not need to be formed if not particularly necessary.

As the method for manufacturing the counter substrate, there are other various modes. For example, after formation of the color filter layer and before formation of the pixel electrode layer, an overcoat layer may be formed. By formation of the overcoat layer, planarity of a surface on which the pixel electrode is formed can be improved, thereby increasing yield. In addition, part of a material included in the color filter layer can be prevented from entering a liquid crystal material. For the overcoat layer, a thermosetting material containing acrylic resin or epoxy resin as a base is used.

Further, before or after formation of the rib, a post spacer (columnar spacer) may be formed as a spacer. The post spacer means a structural object formed at a constant interval on the counter substrate in order to keep the gap between the active matrix substrate and the counter substrate constant. In the case of using a bead spacer (spherical spacer), the post spacer does not have to be formed.

Next, an alignment film is formed over each of the active matrix substrate and the counter substrate. Formation of the alignment film is performed, for example, in such a manner that polyimide resin or the like is melted in an organic solvent; this solution is applied by a printing method, a spin coating method, or the like; and then the substrate is baked after the organic solvent is removed. The thickness of the formed alignment film is generally approximately greater than or equal to 50 nm and less than or equal to 100 nm. Rubbing treatment is performed on the alignment film to align liquid crystal molecules with a certain pretilt angle. The rubbing treatment is performed, for example, by rubbing an alignment film with a shaggy cloth such as a velvet. Note that in the case of using a blue phase or the like, an alignment film does not have to be formed if not necessary.

Then, the active matrix substrate and the counter substrate are attached to each other with a sealant. In the case where a post spacer is not provided on the counter substrate, a bead spacer may be dispersed in a desired region and attachment may be performed.

Next, a liquid crystal material is injected in a space between the active matrix substrate and the counter substrate, which are attached to each other. After injection of the liquid crystal material, an inlet for injection is sealed with an ultraviolet curing resin or the like. Alternatively, after dripping a liquid crystal material to either the active matrix substrate or the counter substrate, the substrates may be attached.

Next, a polarizing plate is attached to both surfaces of a liquid crystal cell, which is formed by attachment of the active matrix substrate and the counter substrate. Then, the cell process is finished.

Next, as the module process, a flexible printed circuit (FPC) is connected to an input terminal of a terminal portion. The FPC has a wiring formed of a conductive film over an organic resin film of polyimide or the like, and is preferably connected to the input terminal through an anisotropic conductive paste (hereinafter referred to as an ACP). The ACP contains a paste that functions as an adhesive, and particles that are plated with gold or the like, have diameters of several tens of micrometers to several hundreds of micrometers, and have conductive surfaces. When the particles mixed in the paste are in contact with a conductive layer over the input terminal and a conductive layer over the terminal connected to the wiring formed in the FPC, electric connection therebetween can be realized.

Figure 8A:
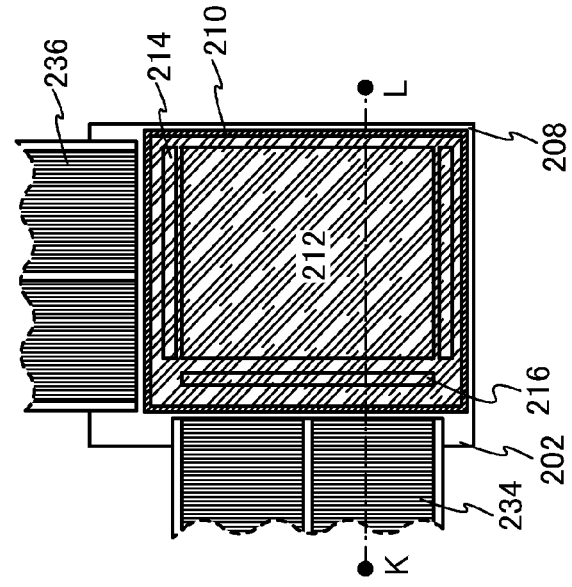
FIG. 8A is a top view and FIG. 8B is a cross-sectional view illustrating a semiconductor device to which an embodiment of the present invention is applied.
Figure 8B:
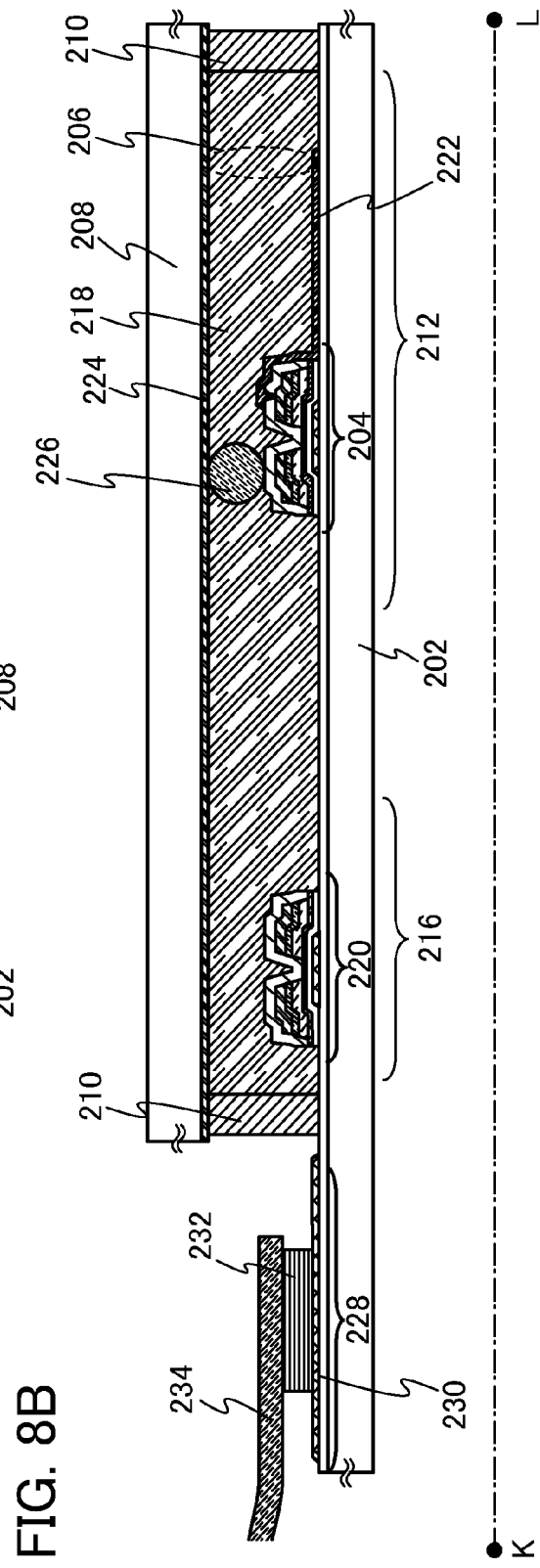

FIG. 8A is a top view of a liquid crystal display device in which a transistor 204 formed over a first substrate 202 which is an active matrix substrate and a liquid crystal element 206 are sealed between the first substrate 202 and a second substrate 208 which is a counter substrate with the use of a sealant 210. FIG. 8B is a cross-sectional view taken along line K-L in FIG. 8A.

The sealant 210 is provided so as to surround a pixel portion 212, a scan line driver circuit 214, and a signal line driver circuit 216 which are provided over the first substrate 202. The second substrate 208 is provided over the pixel portion 212, the scan line driver circuit 214, and the signal line driver circuit 216. Accordingly, the pixel portion 212, the scan line driver circuit 214, and the signal line driver circuit 216 are sealed together with a liquid crystal layer 218 by the first substrate 202, the sealant 210, and the second substrate 208. Although an example in which the scan line driver circuit 214 and the signal line driver circuit 216 are formed using transistors provided over the first substrate 202 is described here, it is not limited thereto. The scan line driver circuit and the signal line driver circuit may be formed using transistors separately formed using a single crystal semiconductor substrate or the like and then attachment may be performed.

The pixel portion 212 provided over the first substrate 202 includes a plurality of transistors, and in FIG. 8B, the transistor 204 included in the pixel portion 212 is illustrated as an example. Further, the scan line driver circuit 214 and the signal line driver circuit 216 each include a plurality of transistors, and in FIG. 8B, a transistor 220 included in the signal line driver circuit 216 is illustrated as an example.

Further, a pixel electrode 222 of the liquid crystal element 206 is electrically connected to a source electrode or a drain electrode of the transistor 204. A counter electrode 224 of the liquid crystal element 206 is provided for the second substrate 208. A portion where the pixel electrode 222, the counter electrode 224, and the liquid crystal layer 218 overlap with one another corresponds to the liquid crystal element 206.

A spacer 226 is a bead spacer and is provided for keeping a distance (cell gap) between the pixel electrode 222 and the counter electrode 224 substantially constant. Note that a spacer (post spacer) obtained by selectively etching an insulating film may be used.

A region 228 is a portion where a terminal electrode 230 is exposed by, for example, a method illustrated in FIG. 7A or FIG. 7B. The terminal electrode 230 is formed using a conductive layer forming gate electrodes of the transistor 204 and the transistor 220. A variety of signals (potentials) supplied to the signal line driver circuit 216 is supplied from a flexible printed circuit (FPC) 234.

The terminal electrode 230 and a terminal of the FPC 234 are electrically connected to each other through an anisotropic conductive layer 232.

Note that as illustrated in FIG. 8A, a variety of signals (potentials) supplied to the scan line driver circuit 214 may be supplied from a flexible printed circuit (FPC) 236 which is connected to the scan line driver circuit side. At this time, a terminal electrode to which the FPC 236 is connected may be formed using a conductive layer forming source electrodes and drain electrodes of the transistor 204 and the transistor 220.

Although not illustrated, the liquid crystal display device illustrated in FIGS. 8A and 8B includes an alignment film and a polarizing plate, and may also include a color filter, a light-blocking layer, or the like.

Electronic paper can be given as an example of a semiconductor device to which the thin film transistor manufactured in the above-described manner is applied. Electronic paper can be used for electronic appliances of a variety of fields as long as they can display data. For example, electronic paper can be applied to an e-book reader (e-book), a poster, digital signage, a public information display (PID), an advertisement in a vehicle such as a train, displays of various cards such as a credit card, and the like. An example of an electronic appliance is illustrated in FIG. 9.

Figure 9:
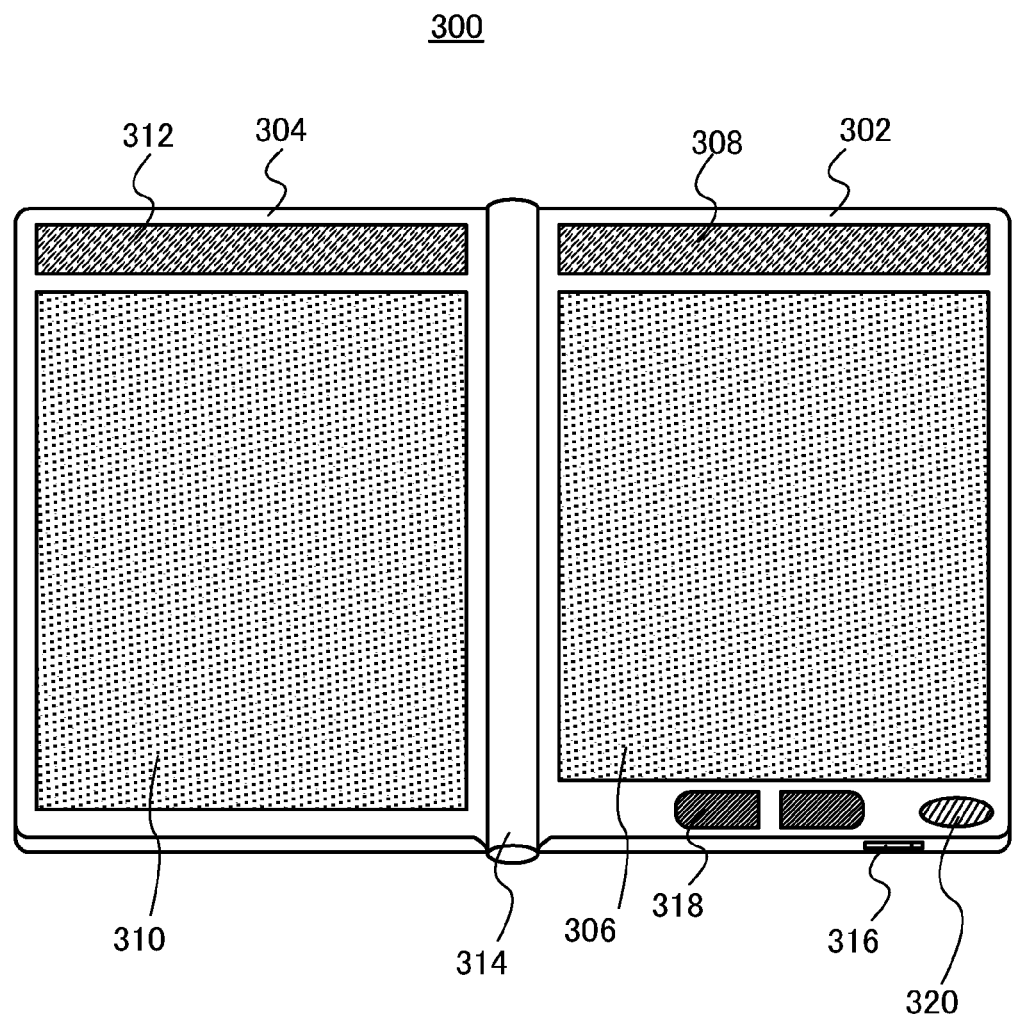
FIG. 9 is a diagram illustrating a semiconductor device to which an embodiment of the present invention is applied.

FIG. 9 illustrates an example of an e-book reader. For example, an e-book reader 300 includes two housings, a housing 302 and a housing 304. The housing 302 and the housing 304 are combined with a hinge 314 so that the e-book reader 300 can be opened and closed with the hinge 314 as an axis. With such a structure, the e-book reader 300 can be handled like a paper book.

A display portion 306 and a photoelectric conversion device 308 are incorporated in the housing 302. A display portion 310 and a photoelectric conversion device 312 are incorporated in the housing 304. The display portion 306 and the display portion 310 may be configured to display one image or different images. According to the structure where different images are displayed in different display portions, for example, text can be displayed on the right display portion (the display portion 306 in FIG. 9) and images can be displayed on the left display portion (the display portion 310 in FIG. 9).

FIG. 9 illustrates the example in which the housing 302 is provided with an operation portion and the like. For example, the housing 302 is provided with a power switch 316, operation keys 318, a speaker 320, and the like. Pages can be turned with the operation keys 318. Note that a keyboard, a pointing device, or the like may also be provided on the surface of the housing, on which the display portion is provided. Further, an external connection terminal (an earphone terminal, a USB terminal, a terminal connectable to an AC adapter or a variety of cables such as a USB cable, or the like), a recording medium insertion portion, and the like may be provided on the back surface or the side surface of the housing. Furthermore, the e-book reader 300 may have a function of an electronic dictionary.

The e-book reader 300 may have a configuration capable of wirelessly transmitting and receiving data. Through wireless communication, desired book data or the like can be purchased and downloaded from an electronic book server.

Further, as a semiconductor device to which an embodiment of the present invention is applied, a variety of electronic appliances (including an amusement machine) can be given in addition to electronic paper. Examples of electronic appliances are a television device (also referred to as a television or a television receiver), a monitor of a computer or the like, a camera such as a digital camera or a digital video camera, a digital photo frame, a mobile phone (also referred to as a cellular phone or a mobile phone device), a portable game console, a personal digital assistant, an audio reproducing device, a large-sized game machine such as a pachinko machine, and the like.

Figure 10A:
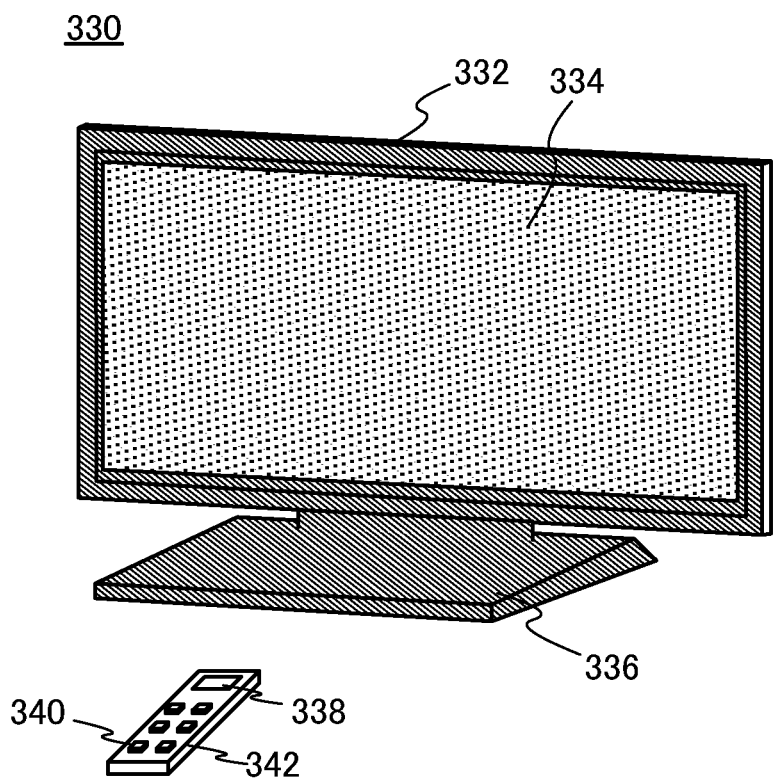
FIGS. 10A and 10B are diagrams illustrating a semiconductor device to which an embodiment of the present invention is applied.

FIG. 10A illustrates an example of a television device. In a television set 330, a display portion 334 is incorporated in a housing 332. The display portion 334 can display images. Further, the housing 332 is supported by a stand 336 here.

The television device 330 can be operated by an operation switch of the housing 332 or a separate remote controller 342. Channels and volume can be controlled by an operation key 340 of the remote controller 342, so that an image displayed on the display portion 334 can be controlled. Further, the remote controller 342 may be provided with a display portion 338 which displays data output from the remote controller 342.

Note that the television set 330 is provided with a receiver, a modem, and the like. With the use of the receiver, general television broadcasting can be received. Moreover, when the television set 330 is connected to a communication network with or without wires via the modem, one-way (from a sender to a receiver) or two-way (between a sender and a receiver or between receivers) information communication can be performed.

Figure 10B:
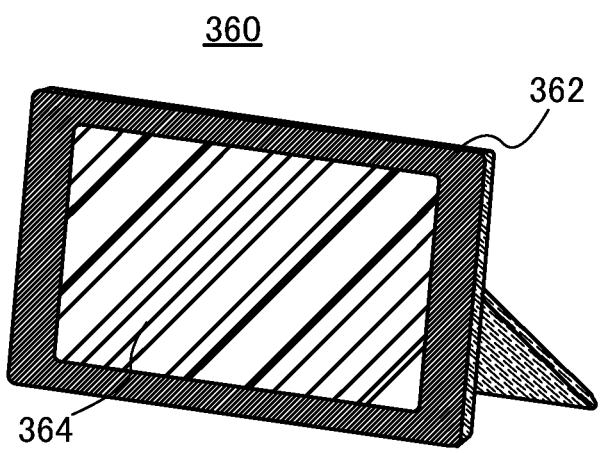

FIG. 10B illustrates an example of a digital photo frame. For example, in a digital photo frame 360, a display portion 364 is incorporated in a housing 362. The display portion 364 can display various images. For example, the display portion 364 can display data of an image shot by a digital camera or the like to function as a normal photo frame.

Note that the digital photo frame 360 is provided with an operation portion, an external connection terminal (a USB terminal, a terminal connectable to various cables such as a USB cable, or the like), a recording medium insertion portion, and the like. Although these components may be provided on the surface on which the display portion is provided, it is preferable to provide them on the side surface or the back surface for the design of the digital photo frame 360. For example, a memory storing data of an image shot by a digital camera is inserted into the recording medium insertion portion of the digital photo frame, whereby the image data can be transferred and then displayed on the display portion 364.

The digital photo frame 360 may have a configuration capable of wirelessly transmitting and receiving data. Through wireless communication, desired image data can be downloaded to be displayed.

Figure 11:
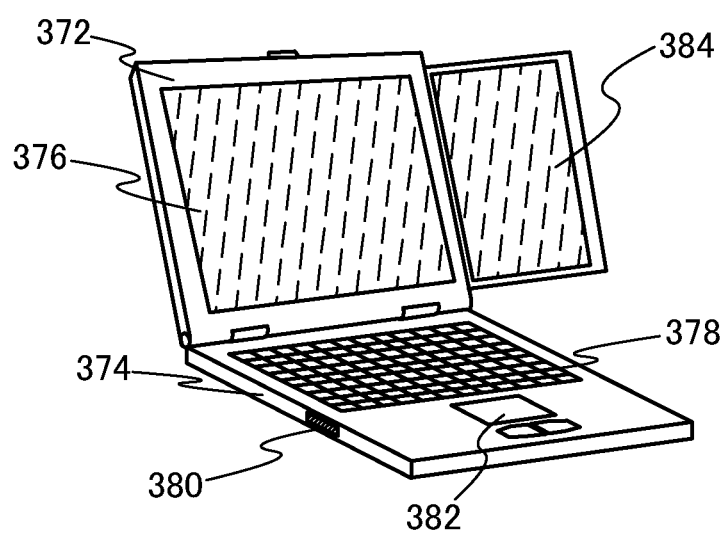
FIG. 11 is a diagram illustrating a semiconductor device to which an embodiment of the present invention is applied.

FIG. 11 is a perspective view illustrating an example of a portable computer.

In a portable computer 370 in FIG. 11, a top housing 372 having a display portion 376 and a bottom housing 374 having a keyboard 378 can overlap with each other by closing a hinge unit which connects the top housing 372 and the bottom housing 374. The portable computer 370 is convenient for carrying around. Moreover, in the case of using the keyboard for input, the hinge unit is opened so that a user can input looking at the display portion 376.

The bottom housing 374 includes a pointing device 382 with which input can be performed, in addition to the keyboard 378. Further, when the display portion 376 is a touch input panel, input can be performed by touching part of the display portion. The bottom housing 374 includes an arithmetic function portion such as a CPU or hard disk. In addition, the bottom housing 374 includes an external connection port 380 into which another device such as a communication cable conformable to communication standards of a USB is inserted.

The top housing 372 further includes a display portion 384 which can be stored in the top housing 372 by being slid therein. With the display portion 384, a large display screen can be realized. In addition, the user can adjust the orientation of a screen of the storable display portion 384. When the storable display portion 384 is a touch input panel, input can be performed by touching part of the storable display portion.

The display portion 376 or the storable display portion 384 is formed using an image display device such as a liquid crystal display device or a light-emitting display device including an organic light-emitting element, an inorganic light-emitting element, or the like.

In addition, the portable computer in FIG. 11 can be provided with a receiver and the like and can receive television broadcasting to display images on the display portion. The user can watch television broadcasting when the whole screen of the display portion 384 is exposed by sliding the display portion 384 while the hinge unit which connects the top housing 372 and the bottom housing 374 is kept closed. In this case, the hinge unit is not opened and display is not performed on the display portion 376. In addition, start up of only a circuit for displaying television broadcasting is performed. Therefore, power consumption can be minimized, which is advantageous for the portable computer whose battery capacity is limited.

This application is based on Japanese Patent Application serial no. 2010-204967 filed with Japan Patent Office on Sep. 13, 2010, and Japanese Patent Application serial no. 2010-204970 filed with Japan Patent Office on Sep. 13, 2010, the entire contents of which are hereby incorporated by reference.

What is claimed is:

1. A method for manufacturing a semiconductor device comprising:
   forming a gate electrode;
   stacking a gate insulating film, a semiconductor film, an impurity semiconductor film, and a conductive film in this order to cover the gate electrode;
   processing the conductive film to form a source electrode and a drain electrode;
   processing an upper part of the semiconductor film to form a source region, a drain region, and a semiconductor layer, the upper part of a portion of which does not overlap with the source region and the drain region is removed, while the impurity semiconductor film is divided;
   forming a passivation film over the gate insulating film, the semiconductor layer, the source region, the drain region, the source electrode, and the drain electrode;
   forming an etching mask over the passivation film;
   processing the passivation film, the semiconductor layer, and the gate insulating film to have an island shape, while an opening reaching the source electrode or the drain electrode is formed, with the use of the etching mask;
   removing the etching mask; and
   forming an electrode over the gate insulating film and the passivation film,
   wherein before the semiconductor film is formed, a surface of the gate insulating film is exposed to plasma generated using a gas containing oxygen.

2. The method for manufacturing a semiconductor device according to claim 1, wherein the passivation film is provided over the electrode.

3. The method for manufacturing a semiconductor device according to claim 1, wherein the gate electrode is formed over a substrate provided with a base film.

4. The method for manufacturing a semiconductor device according to claim 3, wherein after the electrode is formed, part of an end portion of the substrate is soaked in an etchant for etching the gate insulating film and the passivation film, and a terminal electrode formed using the same layer as the gate electrode is exposed.

5. The method for manufacturing a semiconductor device according to claim 1, wherein the gate electrode is formed over a substrate, and
wherein after the electrode is formed, part of an end portion of the substrate is soaked in an etchant for etching the gate insulating film and the passivation film, and a terminal electrode formed using the same layer as the gate electrode is exposed.

6. The method for manufacturing a semiconductor device according to claim 1, wherein after the passivation film and the semiconductor layer are processed to have an island shape, insulation treatment is performed on an exposed portion of the island-shaped semiconductor layer.

7. The method for manufacturing a semiconductor device according to claim 6, wherein the insulation treatment is oxidation treatment using oxygen plasma.

8. The method for manufacturing a semiconductor device according to claim 1, wherein the semiconductor film is a stacked semiconductor film in which the semiconductor film including an amorphous part is formed on a crystalline semiconductor film.

9. A method for manufacturing a semiconductor device comprising:
    forming a gate electrode;
    stacking a gate insulating film, a semiconductor film, an impurity semiconductor film, and a conductive film in this order to cover the gate electrode;
    processing the conductive film to form a source electrode and a drain electrode;
    processing an upper part of the semiconductor film to form a source region, a drain region, and a semiconductor layer, the upper part of a portion of which does not overlap with the source region and the drain region is removed, while the impurity semiconductor film is divided;
    forming a passivation film over the gate insulating film, the semiconductor layer, the source region, the drain region, the source electrode, and the drain electrode;
    forming an etching mask over the passivation film;
    processing the passivation film and the semiconductor layer to have an island shape while an opening reaching the source electrode or the drain electrode is formed, with the use of the etching mask;
    removing the etching mask; and
    forming an electrode over the gate insulating film and the passivation film,
    wherein before the semiconductor film is formed, a surface of the gate insulating film is exposed to plasma generated using a gas containing oxygen.

10. The method for manufacturing a semiconductor device according to claim 9, wherein the passivation film is provided over the electrode.

11. The method for manufacturing a semiconductor device according to claim 9, wherein the gate electrode is formed over a substrate provided with a base film.

12. The method for manufacturing a semiconductor device according to claim 11, wherein after the electrode is formed, part of an end portion of the substrate is soaked in an etchant for etching the gate insulating film and the passivation film, and a terminal electrode formed using the same layer as the gate electrode is exposed.

13. The method for manufacturing a semiconductor device according to claim 9,
    wherein the gate electrode is formed over a substrate, and
    wherein after the electrode is formed, part of an end portion of the substrate is soaked in an etchant for etching the gate insulating film and the passivation film, and a terminal electrode formed using the same layer as the gate electrode is exposed.

14. The method for manufacturing a semiconductor device according to claim 9, wherein after the passivation film and the semiconductor layer are processed to have an island shape, insulation treatment is performed on an exposed portion of the island-shaped semiconductor layer.

15. The method for manufacturing a semiconductor device according to claim 14, wherein the insulation treatment is oxidation treatment using oxygen plasma.

16. The method for manufacturing a semiconductor device according to claim 9, wherein the semiconductor film is a stacked semiconductor film in which the semiconductor film including an amorphous part is formed on a crystalline semiconductor film.

17. The method for manufacturing a semiconductor device according to claim 1, wherein the island-shaped semiconductor layer is processed by etching using a gas including fluorine or chlorine.

18. The method for manufacturing a semiconductor device according to claim 9, wherein the island-shaped semiconductor layer is processed by etching using a gas including fluorine or chlorine.

19. The method for manufacturing a semiconductor device according to claim 1, wherein the semiconductor layer comprises at least one of halogen and nitrogen.

20. The method for manufacturing a semiconductor device according to claim 9, wherein the semiconductor layer comprises at least one of halogen and nitrogen.

* * * * *